(12) United States Patent
Kasa et al.

(10) Patent No.: US 7,012,838 B2
(45) Date of Patent: Mar. 14, 2006

(54) NONVOLATILE SEMICONDUCTOR MEMORY DEVICE SUPPLYING PROPER PROGRAM POTENTIAL

(75) Inventors: Yasushi Kasa, Kawasaki (JP); Jyoji Kato, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/631,856

(22) Filed: Aug. 1, 2003

(65) Prior Publication Data

US 2004/0062078 A1 Apr. 1, 2004

(30) Foreign Application Priority Data

Sep. 13, 2002 (JP) .................................. 2002-268315

(51) Int. Cl.
 *G11C 16/00* (2006.01)

(52) U.S. Cl. .............................. 365/185.28; 365/185.11; 365/185.18

(58) Field of Classification Search ............ 365/185.28, 365/185.11, 185.18, 185.02
See application file for complete search history.

(56) References Cited

U.S. PATENT DOCUMENTS 5,337,281 A  *  8/1994  Kobayashi et al. ..... 365/185.13
5,798,966 A     8/1998  Keeney
6,680,865 B1 *  1/2004  Watanabe .............. 365/185.26
6,751,133 B1 *  6/2004  Kurosaki ............... 365/189.11

FOREIGN PATENT DOCUMENTS

JP          11-297086       10/1999

* cited by examiner

*Primary Examiner*—Tan T. Nguyen
(74) *Attorney, Agent, or Firm*—Arent Fox PLLC

(57) ABSTRACT

A nonvolatile semiconductor memory device includes a plurality of blocks each having a nonvolatile memory cell array, and a program potential generating circuit which supplies a program potential to the nonvolatile memory cell array, wherein the program potential generating circuit adjusts the program potential according to a first address signal selecting one of the blocks and a second address signal indicating a position of a write-accessed memory cell in the noted one of the blocks.

5 Claims, 6 Drawing Sheets

FIG.6

| PGM | HIT | A23 | VPROG-ADJ ||
| --- | --- | --- | --- | --- |
| | | | 1 | 0 |
| L | X | X | L | L |
| H | H | X | H | H |
| | L | H | A21 | A20 |
| | | L | A21B | A20B |

NONVOLATILE SEMICONDUCTOR MEMORY DEVICE SUPPLYING PROPER PROGRAM POTENTIAL

CROSS-REFERENCE TO RELATED APPLICATIONS

The present application is based upon and claims the benefit of priority from the prior Japanese Patent Application No. 2002-268315 filed on Sep. 13, 2002, with the Japanese Patent Office, the entire contents of which are incorporated herein by reference.

BACKGROUND OF THE INVENTION

1. Field of the Invention

The present invention generally relates to nonvolatile semiconductor memory devices, and particularly relates to a nonvolatile semiconductor memory device in which a memory cell array is divided into a plurality of blocks.

2. Description of the Related Art

When data is to be written into a flash memory, high potential is applied to the gate and drain of a memory cell, thereby injecting channel hot electron into the floating gate. The potential applied to the drain of the memory cell is preferably set to as high potential as possible when considering the speed of data writing. If this potential is too high, however, drain disturb occurs at memory cells that are not selected. This causes charge loss, i.e., electron trapped in the floating gate leaks. The potential applied to the drain should thus be set within a predetermined range.

In conventional flash memories, such drain potential is set to a predetermined level by a booster circuit and a regulator circuit. As the length of bit lines increases together with the size of flash memories, a potential drop caused by bit-line resistance becomes increasingly noticeable when electric currents run through bit lines. This is especially so near the endpoint of the bit lines. This makes it difficult to set the drain potential at the time of write operations within a predetermined range with respect to all the memory cells.

In order to obviate this problem, Japanese Patent Application No. 2001-303709, which was filed by the same applicant as this application, adjusts a potential regulated by a regulator circuit according to address signals that determine the position of accessed memory cells, thereby setting the drain potential within a predetermined range. The regulator circuit divides a boosted potential generated by a booster circuit by use of a series connection of condensers, and adjusts the output potential (drain potential) according to the comparison of the divided potential with a reference potential. The capacitances of the condensers are controlled based on the address signals, thereby adjusting the output potential in accordance with the position (i.e., address position) on the bit lines.

A further example of the related art (Patent Document 1) adjusts a potential by which data is written.

[Patent Document 1]

Japanese Patent Application Publication No. 11-297086

In semiconductor memory devices such as flash memories, provision is often made to provide a memory cell array that is divided into a plurality of blocks. Such division into blocks can reduce the load on bit lines and word lines, providing the advantage of high-speed data access. In the multi-block configuration, only one set of a booster circuit and a regulator circuit is generally provided, and the output of the regulator circuit is supplied to each memory cell in each block. In such a case, the distance from the regulator circuit to memory cells is not related to addresses in a straightforward manner. Because of this, the technology disclosed in the above-cited patent application does not properly work where a memory cell array is divided into blocks.

Accordingly, there is a need for a nonvolatile semiconductor memory device in which a constant data-write potential is supplied to memory cells regardless of the position of the memory cells even when a memory cell array is divided into a plurality of blocks.

SUMMARY OF THE INVENTION

It is a general object of the present invention to provide a nonvolatile semiconductor memory device that substantially obviates one or more problems caused by the limitations and disadvantages of the related art.

Features and advantages of the present invention will be presented in the description which follows, and in part will become apparent from the description and the accompanying drawings, or may be learned by practice of the invention according to the teachings provided in the description. Objects as well as other features and advantages of the present invention will be realized and attained by a nonvolatile semiconductor memory device particularly pointed out in the specification in such full, clear, concise, and exact terms as to enable a person having ordinary skill in the art to practice the invention.

To achieve these and other advantages in accordance with the purpose of the invention, the invention provides a nonvolatile semiconductor memory device, including a plurality of blocks each having a nonvolatile memory cell array, and a program potential generating circuit which supplies a program potential to the nonvolatile memory cell array, wherein the program potential generating circuit adjusts the program potential according to a first address signal selecting one of the blocks and a second address signal indicating a position of a write-accessed memory cell in the noted one of the blocks.

The nonvolatile semiconductor memory device described above adjusts the program potential according to the first address signal identifying a block and the second address signal specifying the position of a write-accessed memory cell in the identified block. Accordingly, the distance from the regulator to each memory block and the addressing configuration of each memory block are taken into account for the purpose of adjusting the program potential according to the address signals. This provides for a proper program potential to be generated with respect to each memory cell location within each memory block.

Other objects and further features of the present invention will be apparent from the following detailed description when read in conjunction with the accompanying drawings.

BRIEF DESCRIPTION OF THE DRAWINGS

FIG. 6 is a logic-value table that shows inputs and outputs of a logic circuit shown in FIG. 5.

DESCRIPTION OF THE PREFERRED EMBODIMENTS

In the following, embodiments of the present invention will be described with reference to the accompanying drawings.

Figure 1:
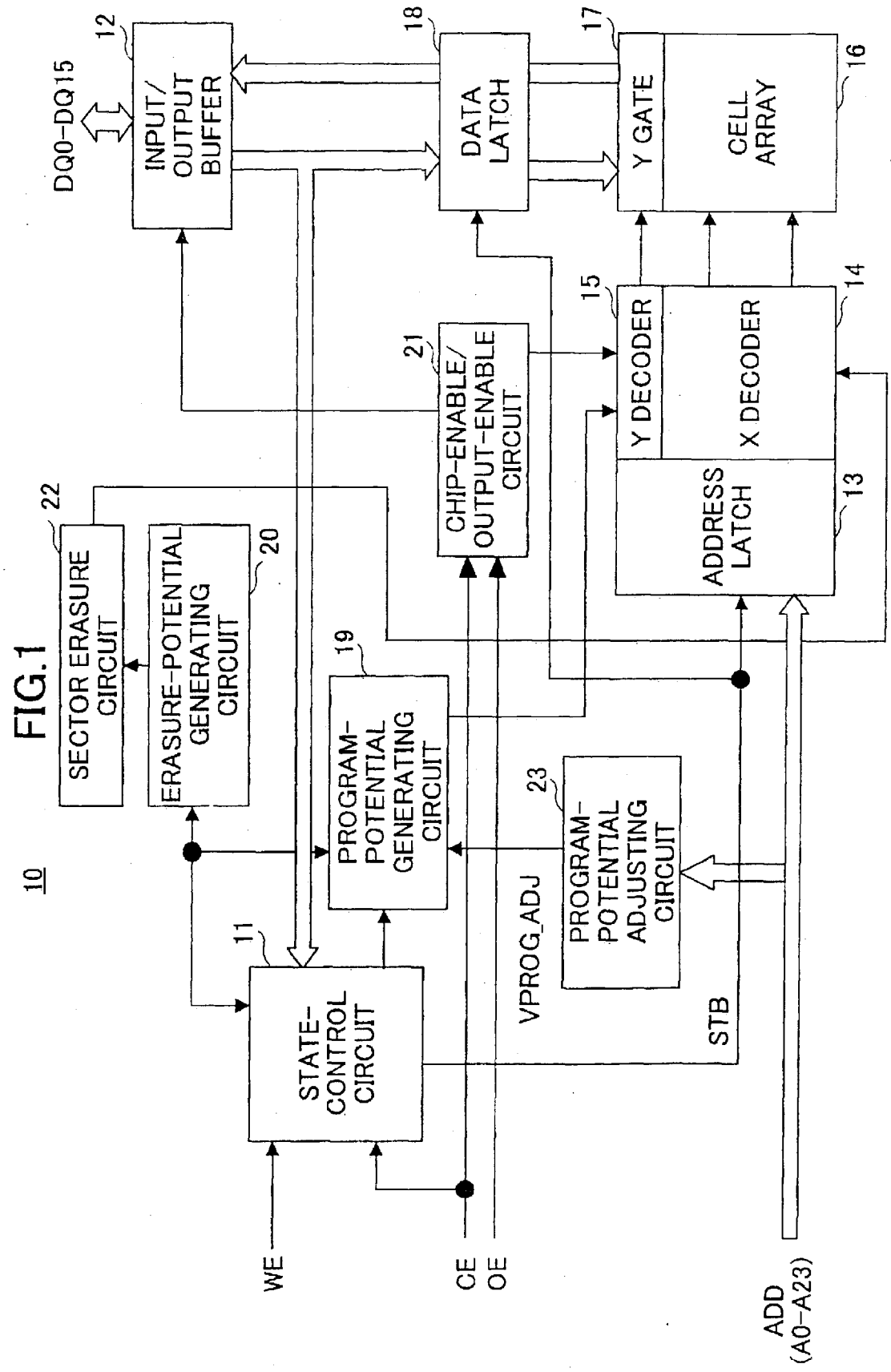
FIG. 1 is a block diagram of a nonvolatile semiconductor memory device according to the present invention.

FIG. 1 is a block diagram of a nonvolatile semiconductor memory device according to the present invention.

A nonvolatile semiconductor memory device 10 of FIG. 1 includes a state-control circuit 11, an input/output buffer 12, an address latch 13, an X decoder 14, a Y decoder 15, a cell array 16, a Y gate 17, a data latch 18, a program-potential generating circuit 19, an erasure-potential generating circuit 20, a chip-enable/output-enable circuit 21, a sector erasure circuit 22, and a program-potential adjusting circuit 23.

The state-control circuit 11 receives a write-enable signal WE, a chip-enable signal CE, data signals DQ0 through DQ15, etc., as control signals from the exterior of the device, and operates as a state machine based on the control signals, thereby controlling the operation of each part of the nonvolatile semiconductor memory device 10.

The input/output buffer 12 receives data DQ0 through DQ15 from the exterior of the device, and supplies the received data to the state-control circuit 11 and the data latch 18. The address latch 13 latches address signals ADD supplied from the exterior of the device, and supplies these address signals to the X decoder 14 and the Y decoder 15. The X decoder 14 decodes the address supplied from the address latch 13, and activates a word line provided in the cell array 16 in response to the decoding results. The Y decoder 15 decodes the address supplied from the address latch 13, and controls the Y gate 17 in response to the decoding results, thereby selectively retrieving data from the bit lines of the cell array 16 for transfer to the data latch 18.

The cell array 16 includes an array of memory cell transistors, word lines, bit lines, etc., and stores data in each memory cell transistor. At the time of data reading, data are read from memory cells selected by the activated word line, and are supplied to the bit lines. At the time of programming and erasing, word lines and bit lines are set to potentials suitable for respective operations, thereby injecting or removing electric charge into or from memory cells. Although not explicitly shown in FIG. 1, the cell array 16 is comprised of a plurality of blocks, and peripheral circuitry such as the X decoder 14 and the Y decoder 15 is also provided on a block-by-block basis.

The data latch 18 compares a reference current of a reference cell with a data current that is supplied from the cell array 16 according to selection by the Y decoder 15 and the X decoder 14. This provides the sensing of data as to whether it is 0 or 1. The sensed data is supplied as read data to the input/output buffer 12. Further, a verify check for a program operation or an erase operation is performed by comparing a reference current of a program-verify reference cell or an erase-verify reference cell with a data current, which is supplied from the cell array 16 according to selection by the Y decoder 15 and the X decoder 14.

The program-potential generating circuit 19 operates under the control of the state-control circuit 11 to generate a program potential (i.e., a boosted potential for use in programming). The program potential is used to drive the X decoder 14 and the Y decoder 15, thereby performing data-write operations with respect to the cell array 16, according to write data that is supplied from the input/output buffer 12 to the data latch 18. The erasure-potential generating circuit 20 generates an erasure potential that is to be supplied to word lines and bit liens at the time of an erase operation. The erasure potential is supplied to the sector erasure circuit 22. The sector erasure circuit 22 carries out an erase operation on a sector-specific basis.

The chip-enable/output-enable circuit 21 receives a chip-enable signal CE and an output-enable signal OE as control signals from the exterior of the device, and determines whether to drive the input/output buffer 12 and the cell array 16.

The program-potential adjusting circuit 23 is a circuit characteristic to the present invention, and generates a program-potential adjusting signal VPROG_ADJ based on the address signals ADD for transmission to the program-potential generating circuit 19. The program-potential generating circuit 19 adjusts the program potential according to the program-potential adjusting signal VPROG_ADJ.

Figure 2:
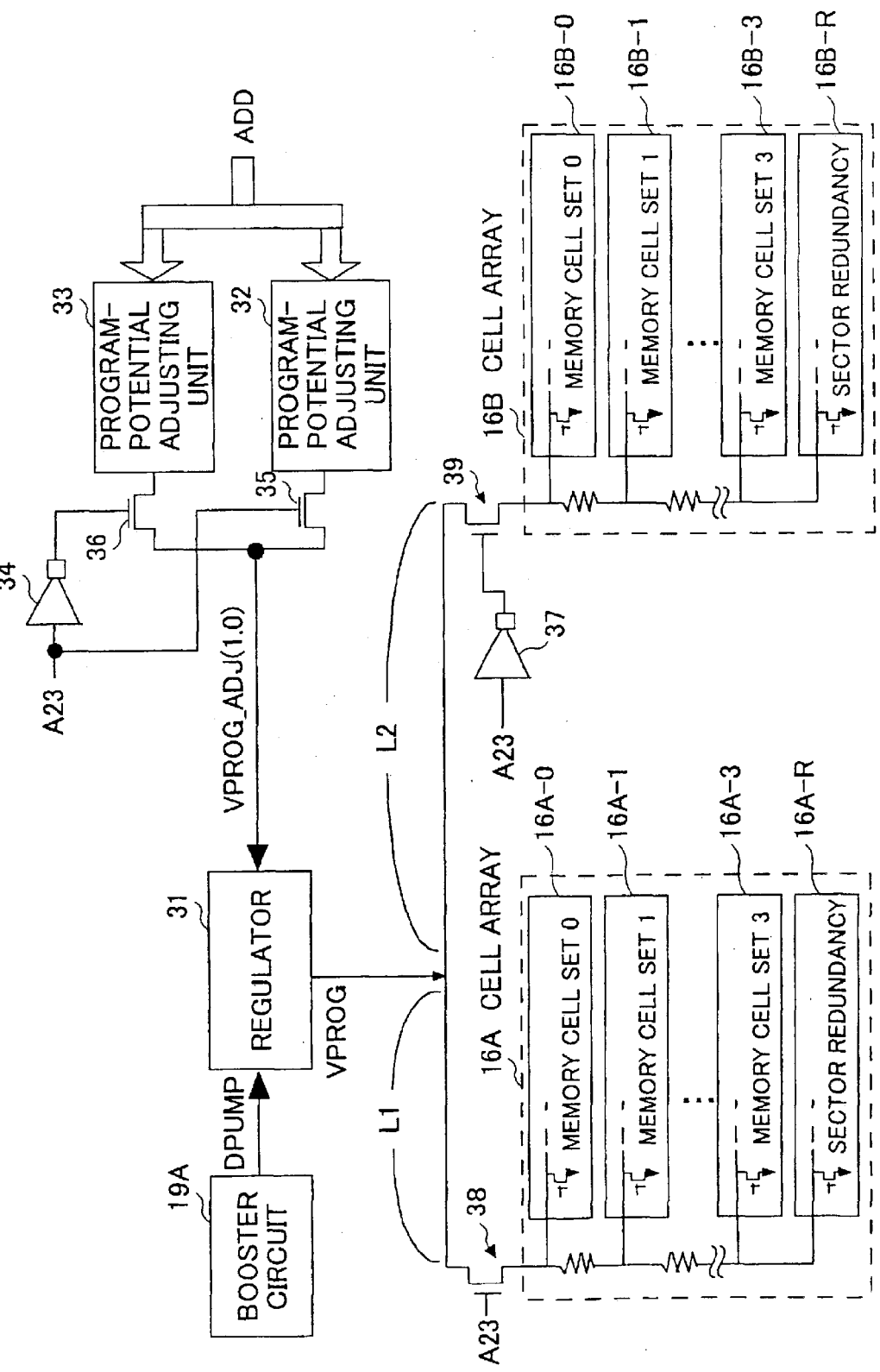
FIG. 2 is a drawing showing an embodiment of a program-potential adjusting circuit and a program-potential generating circuit according to the present invention.

FIG. 2 is a drawing showing an embodiment of the program-potential adjusting circuit 23 and the program-potential generating circuit 19 according to the present invention.

In an example of FIG. 2, the cell array 16 is divided into two blocks, i.e., a cell array 16A and a cell array 16B. The cell array 16A includes memory cell sets 16A-0 through 16A-3 and a sector-redundancy memory cell set 16A-R. The cell array 16B includes memory cell sets 16B-0 through 16B-3 and a sector-redundancy memory cell set 16B-R.

Bit lines of the cell arrays 16A and 16B are coupled to a regulator 31 via gates 38 and 39, respectively. The gates 38 and 39 are controlled by use of the most significant bit A23 of address signals. The gate 38 opens when the bit A23 is HIGH, and the gate 39 is opened by an inverter 37 when the bit A23 is LOW.

The regulator 31 is part of the program-potential generating circuit 19. The regulator 31 operates in such a manner as to adjust a boosted potential DPUMP to a predetermined potential as the boosted potential DPUMP is generated by a booster circuit (i.e., boosted-potential generating circuit) 19A of the program-potential generating circuit 19. Such potential adjustment by the regulator 31 is controlled by the program-potential adjusting signal VPROG_ADJ(1:0) comprised of two bits.

In the example of FIG. 2, the program-potential adjusting circuit 23 includes program-potential adjusting units 32 and 33, gates 35 and 36, and an inverter 34. Each of the program-potential adjusting units 32 and 33 generates the two-bit program-potential adjusting signal VPROG_ADJ (1:0). The most significant bit A23 of address signals selects one of the program-potential adjusting signals VPROG_ADJ(1:0). The selected program-potential adjusting signal VPROG_ADJ(1:0) is supplied to the regulator 31.

Figure 3:
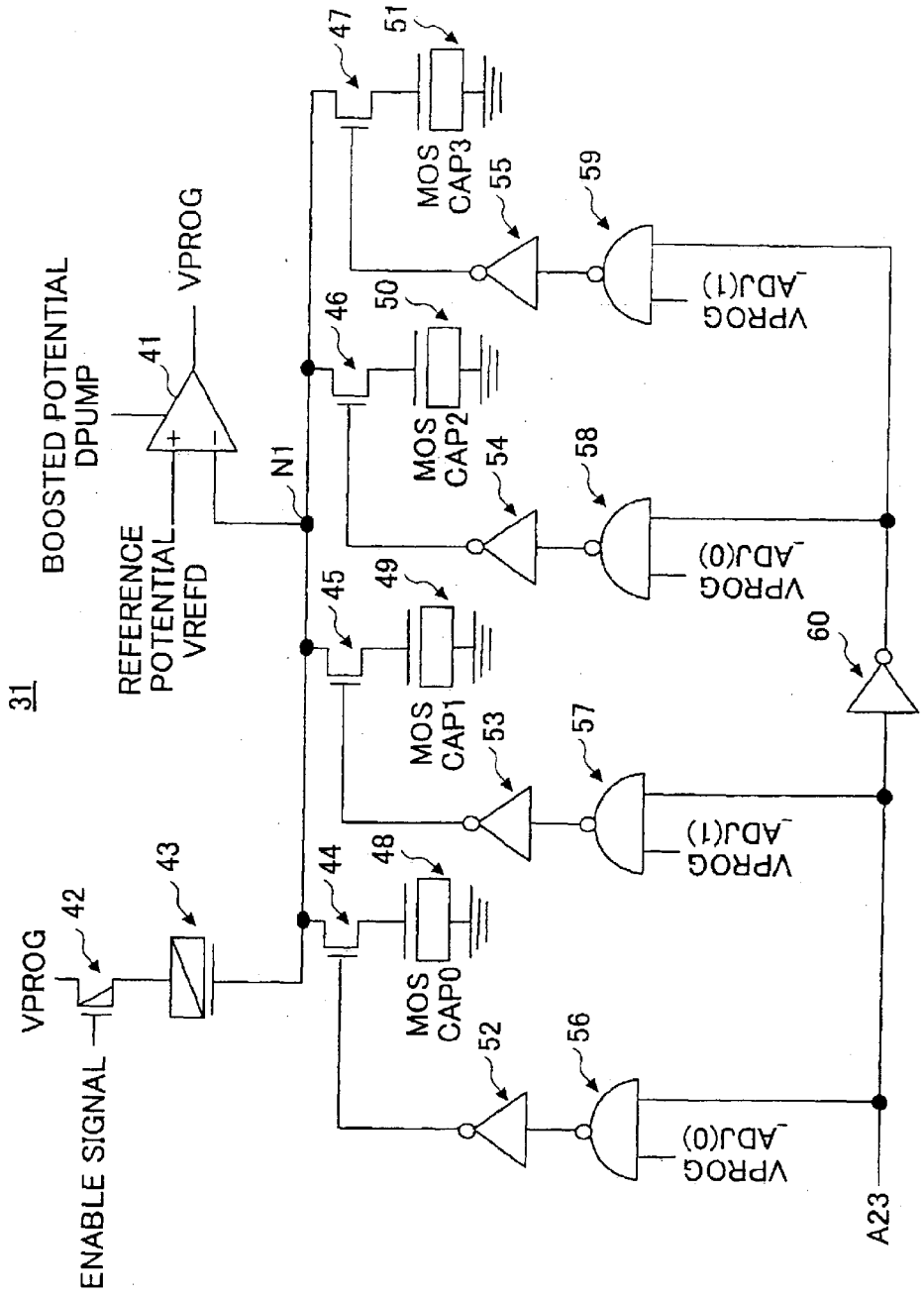
FIG. 3 is a circuit diagram showing an example of a regulator.

FIG. 3 is a circuit diagram showing an example of the regulator 31.

The regulator 31 of FIG. 3 includes a differential amplifier 41, a transistor 42, a condenser 43, transistors 44 through 47, condensers (MOS capacitances) 48 through 51, inverters 52 through 55, NAND circuits 56 through 59, and an inverter 60. The differential amplifier 41 is powered by the boosted potential DPUMP generated by the booster circuit 19A, and generates a program potential VPROG in response to a difference between the potential at a node N1 and a reference potential VREFD. In detail, the program potential VPROG is raised when the potential at the node N1 is lower than the reference potential VREFD, whereas the program potential VPROG is lowered when the potential at the node N1 is higher than the reference potential VREFD. The potential at the node N1 is equal to a fraction of the program potential VPROG divided by the condenser 43. Control as described above thus adjusts the program potential VPROG to a predetermined potential.

The potential at the node N1 is determined by a ratio of the capacitance of the condenser 43 to the capacitance of a selected one of the condensers 48 through 51. Accordingly, it is possible to control the level of the program potential VPROG by selecting one of the condensers 48 through 51.

In this example, the condensers 48 and 49 or the condensers 50 and 51 are chosen according to the most significant bit A23 of the address signals. If the address bit A23 is HIGH, for example, the condensers 48 and 49 are selected. As was described with reference to FIG. 2, the cell array 16A is coupled to the regulator 31 when the address bit 23 is HIGH. In this case, therefore, the condensers 48 and 49 are coupled to the cell array 16A.

The two-bit program-potential adjusting signal VPROG_ADJ(1:0) controls the conductive/non-conductive state of the transistors 44 and 45 so as to control the selected/unselected state of each of the condensers 48 and 49. The program-potential adjusting signal VPROG_ADJ(1:0) corresponds to two bit address signals for selecting the memory cell sets 16A-0 through 16A-3. The program-potential adjusting signal VPROG_ADJ(1:0) is (0,0) when the memory cell set 16A-0 is selected for writing, (0,1) when the memory cell set 16A-1 is selected for writing, (1,0) when the memory cell set 16A-2 is selected for writing, and (1,1) when the memory cell set 16A-3 is selected for writing. In addition, the program-potential adjusting signal VPROG_ADJ(1:0) is also set to (1,1) when the sector-redundancy memory cell set 16A-R is selected. In this manner, capacitance that is coupled in series to the capacitance of the condenser 43 is changed to control the potential at the node N1, thereby adjusting the program potential VPROG.

In FIG. 2, the memory cell arrays 16A and 16B are positioned at respective distances from the regulator 31 as represented by distance L1 and distance L2, respectively. The regulator 31 thus needs to provide different program potentials to reflect the difference in the distance. To this end, the condensers 48 and 49 are selected for the cell array 16A when the address bit A23 is HIGH, while the condensers 50 and 51 are selected for the cell array 16B when the address bit A23 is LOW.

In the example of FIG. 2, the program-potential adjusting units 32 and 33 are provided for the cell arrays 16A and 16B, respectively. This is to ensure that different address configurations between the cell arrays 16A and 16B can be properly taken care of. For example, there may be a case in which an address (0,0) is assigned to the memory cell set 16A-0 at the closest position in the cell array 16A whereas an address (0,0) is assigned to the memory cell set 16B-3 at the farthest away position in the cell array 16B. Even in such a case, the program-potential adjusting unit.33 corresponding to the cell array 16B may manipulate the logic of relevant address bits to generate the program-potential adjusting signal VPROG_ADJ(1:0) conforming to the address configuration of the cell array 16B.

Figure 4:
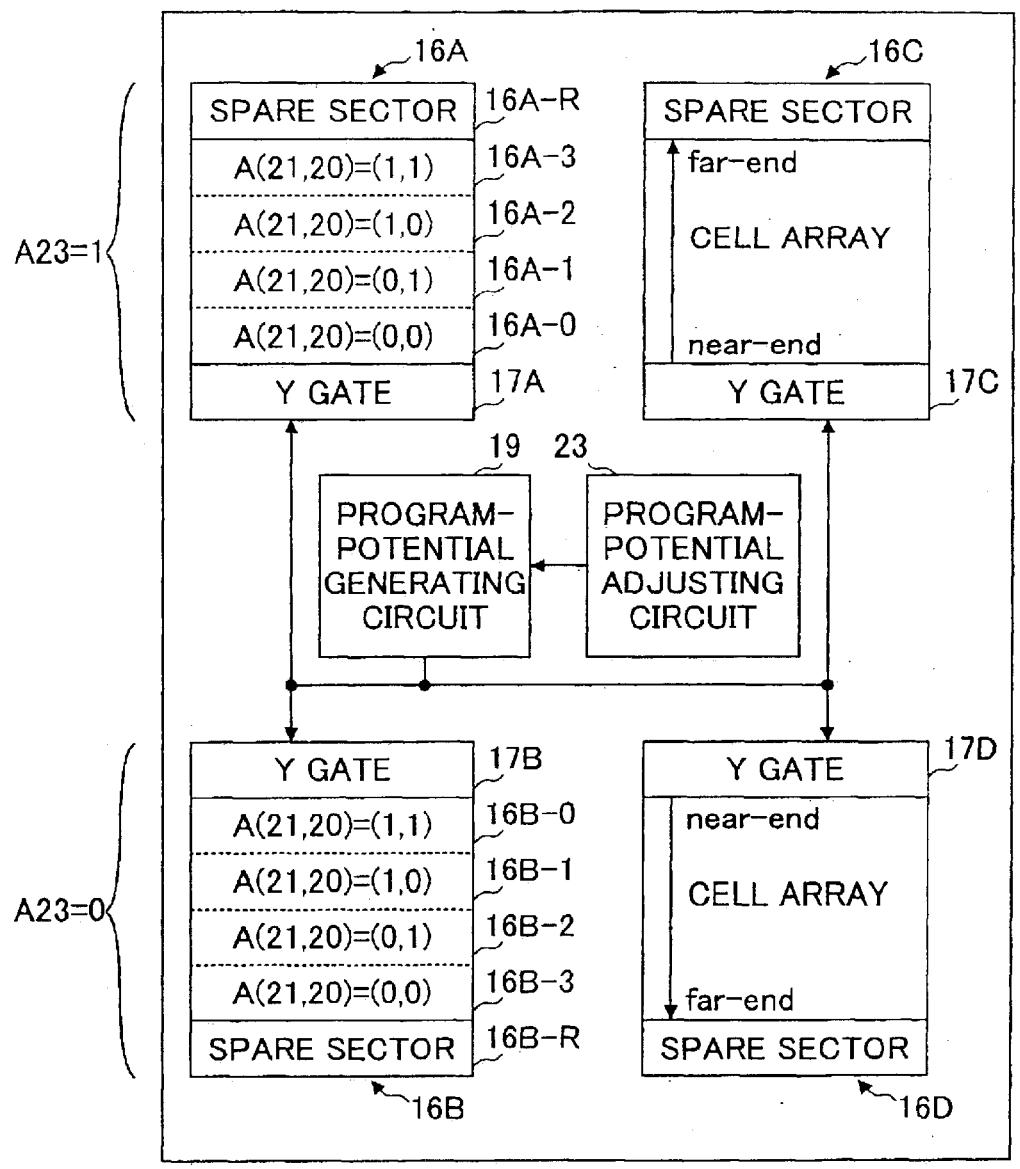
FIG. 4 is a block diagram showing the construction of four blocks into which a memory cell array is divided.

FIG. 4 is a block diagram showing the construction of four blocks into which a memory cell array is divided.

In FIG. 4, the memory cell array is divided into four blocks, i.e., cell arrays 16A through 16D. At the center of the four blocks is located the program-potential generating circuit 19. The program potential VPROG generated by the program-potential generating circuit 19 is supplied to Y gates 17A through 17D of the respective blocks. As shown in FIG. 4, the memory cell sets 16A-0 through 16A-3 of the cell array 16A are selected when the two corresponding bits A21 and A20 of the address signals are (0,0), (0,1), (1,0), and (1,1), respectively. The memory cell sets 16B-0 through 16B-3 of the cell array 16B are selected when the two corresponding bits A21 and A20 of the address signals are (1,1), (1,0), (0,1), and (0,0), respectively. Since the cell array 16A and the cell array 16B have different address configurations, the program-potential adjusting circuit 23 needs to supply different program-potential adjusting signals VPROG_ADJ(1:0) in respect of the respective cell arrays.

Figure 5:
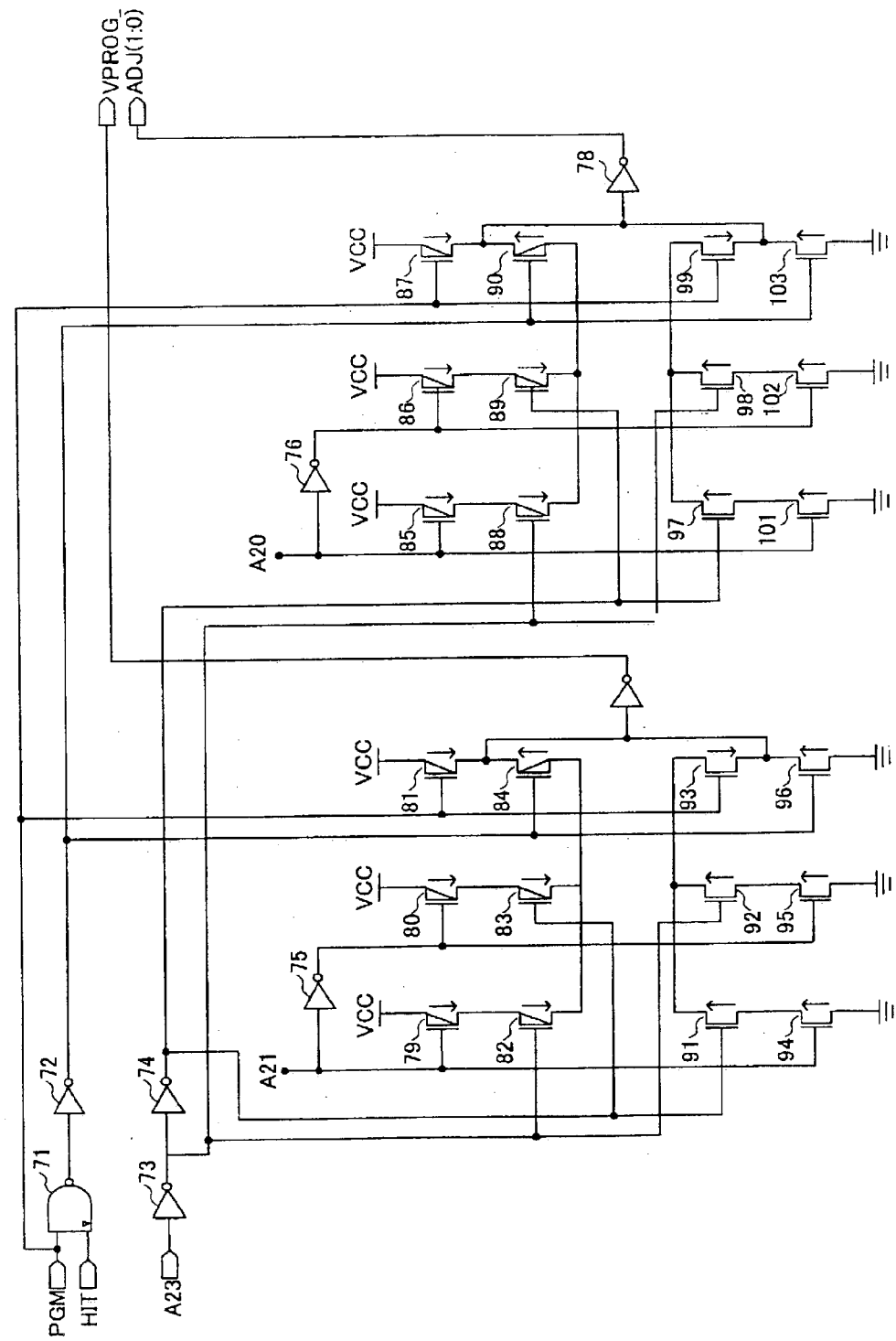
FIG. 5 is a circuit diagram showing an example of a program-potential adjusting circuit used in the construction of FIG. 4.

FIG. 5 is a circuit diagram showing an example of the program-potential adjusting circuit 23 used in the construction of FIG. 4. As shown in FIG. 2, the program-potential adjusting circuit 23 may generate the program-potential adjusting signals VPROG_ADJ(1:0) separately for the cell arrays 16A and 16B by use of the program-potential adjusting units 32 and 33. Unlike this, the construction shown in FIG. 5 achieves all the necessary logic operations, inclusive of the operation of redundancy selection, by use of a single circuit.

The program-potential adjusting circuit 23 of FIG. 5 includes a NAND gate 71, inverters 72 through 78, PMOS transistors 79 through 90, and NMOS transistors 91 through 103. The program-potential adjusting circuit 23 receives two bits A20 and A21 of the address signals, and outputs the two-bit program-potential adjusting signal VPROG_ADJ (1:0). The output of the inverter 77 is a program-potential adjusting signal VPROG_ADJ(1) that corresponds to the address bit A21, and the output of the inverter 78 is a program-potential adjusting signal VPROG_ADJ(0) that corresponds to the address bit A20. The program-potential adjusting signal VPROG_ADJ(1) and the program-potential adjusting signal VPROG_ADJ(0) are put together to be represented as the two-bit signal VPROG_ADJ(1:0).

FIG. 6 is a logic-value table that shows inputs and outputs of the logic circuit shown in FIG. 5.

As shown in FIG. 5 and FIG. 6, a program instruction signal PGM, a redundancy instruction signal HIT, and the most significant address bit A23 are input in addition to the address signals A20 and A21. The program instruction signal PGM becomes HIGH when a programming operation is performed. The redundancy instruction signal HIT becomes HIGH when a redundancy operation is carried out. The circuit outputs are the two-bit program-potential adjusting signal VPROG_ADJ(1:0).

As shown in FIG. 6, the program-potential adjusting signal VPROG_ADJ(1:0) is (L, L) if the program instruction signal PGM is LOW indicative of no program operation, regardless of the signal levels of other signals. When a program operation is performed, i.e., when the program instruction signal PGM is HIGH, the circuit output varies depending on the signal levels of the redundancy instruction signal HIT and the address signal A23. If the redundancy instruction signal HIT is HIGH, the program-potential adjusting signal VPROG_ADJ(1:0) is (H, H) regardless of the signal level of the address signal A23. This provides for a proper program potential VPROG to be generated by the regulator 31 of FIG. 3 and to be supplied to the spare sectors 16A-R and 16B-4, which are located farthest away from the Y gate along the extension of bit lines as shown in FIG. 4.

If the redundancy instruction signal HIT is LOW, the program-potential adjusting signal VPROG_ADJ(1:0) varies depending on the signal level of the address signal A23. As shown in FIG. 6, the program-potential adjusting signal VPROG_ADJ(1:0) is (A21, A20) if the address signal A23 is HIGH. In FIG. 4, the memory cell sets 16A-0 through 16A-3 are selected when (A21, A20) is (0,0), (0,1), (1,0), and (1,1), respectively, in the cell array 16A that is chosen in response to the HIGH level of the signal A23. Accordingly, a proper program potential can be supplied to these memory cell sets by having the regulator 31 adjust the program potential according to the program-potential adjusting signal VPROG-ADJ(1:0) that is no other than (A21, A20).

For example, the memory cell set 16A-0 closest to the Y gate 17A is selected for data writing when (A21, A20) is (0,0). Since the program-potential adjusting signal VPROG_ADJ(1:0) is (0,0) in this case, the regulator 31 selects the program potential VPROG that corresponds to the closest position. The memory cell set 16A-1 that is second closest to the Y gate 17A is selected for data writing when (A21, A20) is (0,1). Since the program-potential adjusting signal VPROG_ADJ(1:0) is (0,1) in this case, the regulator 31 selects the program potential VPROG that corresponds to the second closest position.

If the redundancy instruction signal HIT is LOW and the address signal A23 is LOW, the program-potential adjusting signal VPROG_ADJ(1:0) becomes (A21B, A20B), as shown in FIG. 6, which is an inverse of (A21, A20). In FIG. 4, the memory cell sets 16B-0 through 16B-3 are selected when (A21, A20) is (1,1), (1,0), (0,1), and (0,0), respectively, in the cell array 16B that is chosen in response to the LOW level of the signal A23. Accordingly, a proper program potential can be supplied to these memory cell sets by adjusting the program potential according to the program-potential adjusting signal VPROG_ADJ(1:0) that is an inverse of (A21, A20).

For example, the memory cell set 16B-0 closest to the Y gate 17B is selected for data writing when (A21, A20) is (1,1). Since the program-potential adjusting signal VPROG_ADJ(1:0) is (0,0) in this case, the regulator 31 selects the program potential VPROG that corresponds to the closest position. The memory cell set 16B-1 that is second closest to the Y gate 17B is selected for data writing when (A21, A20) is (1,0). Since the program-potential adjusting signal VPROG_ADJ(1:0) is (0,1) in this case, the regulator 31 selects the program potential VPROG that corresponds to the second closest position.

The same applies in the case of the cell arrays 16D and 16D. The program potential is generated for the cell array 16C in the same manner as for the cell array 16A, and is generated for the cell array 16D in the same manner as for the cell array 16B. In the configuration shown in FIG. 4, there is no need to select either the condensers 48 and 49 or the condensers 50 and 51 in the regulator 31 according to the address signal A23 if the distance from the regulator 31 is the same for both the cell array 16A and the cell array 16B. In such a case, only on set of condensers (e.g., the condensers 48 and 49) may be provided.

In this manner, the present invention takes into account the distance from the regulator to each memory block and the addressing configuration of each memory block in order to adjust the program potential according to the address signals. This provides for a proper program potential to be generated with respect to each memory cell location within each memory block.

In the embodiments described above, a description has been given of a case in which the number of blocks is two or four. The number of memory blocks is not limited to these numbers. Further, a description has been given of a case in which four memory cell sets (five if the redundancy memory cell set is included) are provided within each memory cell block. The number of memory cell sets may be any number other than four, such as five or a higher number. In such a case, the number of bits that constitute the program-potential adjusting signal VPROG_ADJ may be determined according to the step size that is desired for potential adjustment. Even if the number of memory cell sets is 16, for example, a total of four wide steps for potential adjustment may be sufficient. If this is the case, the number of bits of the program-potential adjusting signal VPROG_ADJ is set to two. Alternatively, a total of 16 narrower steps for potential adjustment may be desired when the number of memory cell sets is 16. If this is the case, the number of bits of the program-potential adjusting signal VPROG_ADJ is set to four.

In the embodiments described above, the program-potential adjusting signal VPROG_ADJ is comprised of n bits, and the regulator 31 performs program-potential adjustment through $2^n$ adjustment steps. Alternatively, provision may be made to select one condenser corresponding to one of the n bits of the program-potential adjusting signal VPROG_ADJ, thereby achieving the n-step adjustment of a program potential.

Further, the present invention is not limited to these embodiments, but various variations and modifications may be made without departing from the scope of the present invention.

What is claimed is:

1. A nonvolatile semiconductor memory device comprising:
   a plurality of blocks each having a nonvolatile memory cell array; and
   a program potential generating circuit which supplies a program potential to the nonvolatile memory cell array,
   wherein said program potential generating circuit adjusts the program potential according to a first address signal selecting one of said blocks and a second address signal indicating a position of a write-accessed memory cell in said one of said blocks, and
   wherein said program potential generating circuit includes:
   a booster circuit which generates a boosted potential; and
   a regular circuit which generates the program potential according to the boosted potential and a reference potential, wherein the program potential generated by said regulator circuit is adjusted according to the first address signal and the second address signal.

2. The nonvolatile semiconductor memory device as claimed in claim 1, wherein said program potential generating circuit includes:
   a capacitance circuit which generates a comparison potential by dividing the program potential by use of capacitances;
   a different amplifier circuit which generates the program potential from the boosted potential in response to a comparison between the comparison potential and the reference potential; and
   a circuit which adjusts the capacitances of said capacitance circuit according to the first address signal and the second address signal.

3. A nonvolatile semiconductor memory device comprising:

a plurality of blocks each having a nonvolatile memory cell array;

a program potential generating circuit which supplies a program potential to the nonvolatile memory cell array, wherein said program potential generating circuit adjusts the program potential according to a first address signal selecting one of said blocks and a second address signal indicating a position of a write-accessed memory cell in said one of said blocks; and a program potential adjusting circuit which generates a program potential adjusting signal according to the first address signal and the second address singal, wherein said program potential generating circuit adjusts the program potential according to the program potential adjusting signal, and wherein said program potential adjusting circuit performs inversion control that either inverts or does not invert the second address signal, depending on the first address signal, and supplies the second address signal having undergone the inversion control to said program potential generating circuit as the program potential adjusting signal.

4. The nonvolatile semiconductor memory device as claimed in claim 3, wherein said plurality of blocks each includes a redundancy memory cell, and said program potential adjusting circuit generates the program potential adjusting signal independently of the second address signal if said redundancy memory cell is selected, the program potential adjusting signal reflecting an actual wire length from said program potential generating circuit to the selected redundancy memory cell.

5. A nonvolatile semiconductor memory device comprising:

a plurality of blocks each having a nonvolatile memory cell array; and a program potential generating circuit which supplies a program potential to the nonvolatile memory cell array, wherein said program potential generating circuit adjusts the program potential according to a first address signal selecting one of said blocks and a second address signal indicating a position of a write-accessed memory cell in said one of said blocks, and wherein two of said blocks have different arrangements of a second address represented by the second address signal such that the second address is arranged in reversed orders between the two blocks in relation to distance from said program potential generating circuit, the program potential adjusted according to the second address signal after identifying one of the two blocks according to the first address signal, such as to reflect a physical distance from said program potential generating circuit to the position of the write-accessed memory cells.

* * * * *